United States Patent
Astrom et al.

(10) Patent No.: US 9,979,421 B2
(45) Date of Patent: May 22, 2018

(54) DIGITAL PRE-DISTORTION (DPD) TRAINING AND CALIBRATION SYSTEM AND RELATED TECHNIQUES

(71) Applicant: Eta Devices, Inc., Cambridge, MA (US)

(72) Inventors: Mattias Astrom, Lexington, MA (US); Mark A. Briffa, Tyreso (SE); Joel L. Dawson, Roslindale, MA (US); John Hoversten, Lafayette, CO (US); Per-Ludvig B. Normark, Djursholm (SE); Yevgeniy A. Tkachenko, Belmont, MA (US)

(73) Assignee: Eta Devices, Inc., Cambridge, MA (US)

( * ) Notice: Subject to any disclaimer, the term of this patent is extended or adjusted under 35 U.S.C. 154(b) by 2 days.

(21) Appl. No.: 15/058,742

(22) Filed: Mar. 2, 2016

(65) Prior Publication Data

US 2016/0261295 A1 Sep. 8, 2016

Related U.S. Application Data

(60) Provisional application No. 62/126,949, filed on Mar. 2, 2015.

(51) Int. Cl.
  *H04B 1/04* (2006.01)
  *H04B 17/11* (2015.01)
  *H04B 17/10* (2015.01)

(52) U.S. Cl.
  CPC ........... *H04B 1/0475* (2013.01); *H04B 17/11* (2015.01); *H04B 17/104* (2015.01); *H04B 2001/0425* (2013.01)

(58) Field of Classification Search
  CPC ............................. H04B 1/0475; H04B 17/13
  See application file for complete search history.

(56) References Cited

U.S. PATENT DOCUMENTS 4,129,839 A   12/1978   Galani et al.
4,835,493 A   5/1989   Walsh, Jr.
(Continued)

FOREIGN PATENT DOCUMENTS

EP   1 750 366 A2   2/2007
EP   1 750 366 A3   2/2007
(Continued)

OTHER PUBLICATIONS

Sungwon Chung, et al., "Asymmetric Multilevel Outphasing Architecture for Multi-Standard Trasmitters", 2009 IEEE Radio Frequency Integrated Circuits Symposium, pp. 237-240; 4 pages.
(Continued)

*Primary Examiner* — Jaison Joseph
(74) *Attorney, Agent, or Firm* — Daly, Crowley, Mofford & Durkee, LLP

(57) ABSTRACT

A radio frequency (RF) transmit system includes an observation receiver coupled to receive a portion of an RF signal propagating along an RF transmit signal path and a digital pre-distortion (DPD) system coupled to the observation receiver and configured to receive one or more signals from the observation receiver and in response thereto, to adapt one or more DPD values of the RF transmit system over a period of time and a range of operating conditions of the RF transmit system and to provide one or more adapted DPD values to said controller.

33 Claims, 4 Drawing Sheets

(56) References Cited

U.S. PATENT DOCUMENTS

| | | | |
|---|---|---|---|
| 5,012,200 | A | 4/1991 | Meinzer |
| 5,561,395 | A | 10/1996 | Melton et al. |
| 5,847,602 | A | 12/1998 | Su |
| 5,892,395 | A | 4/1999 | Stengel et al. |
| 6,043,707 | A | 3/2000 | Budnik |
| 6,081,161 | A | 6/2000 | Dacus et al. |
| 6,133,788 | A | 10/2000 | Dent |
| 6,140,807 | A | 10/2000 | Vannatta et al. |
| 6,255,906 | B1 | 7/2001 | Eidson et al. |
| 6,327,462 | B1 | 12/2001 | Loke et al. |
| 6,377,117 | B2 | 4/2002 | Oskowsky et al. |
| 6,396,341 | B1 | 5/2002 | Pehlke |
| 6,449,465 | B1 | 9/2002 | Gailus et al. |
| 6,535,066 | B1 | 3/2003 | Petsko |
| 6,566,944 | B1 | 5/2003 | Pehlke et al. |
| 6,738,432 | B2 | 5/2004 | Pehlke et al. |
| 6,788,151 | B2 | 9/2004 | Shvarts et al. |
| 6,799,020 | B1 | 9/2004 | Heidmann et al. |
| 6,975,166 | B2 | 12/2005 | Grillo et al. |
| 7,068,984 | B2 | 6/2006 | Mathe et al. |
| 7,091,772 | B2 | 8/2006 | Friedel et al. |
| 7,103,114 | B1 | 9/2006 | Lapierre |
| 7,236,542 | B2 | 6/2007 | Matero |
| 7,279,971 | B2 | 10/2007 | Hellberg et al. |
| 7,330,070 | B2 | 2/2008 | Vaisanen |
| 7,362,251 | B2 | 4/2008 | Jensen et al. |
| 7,411,449 | B2 | 8/2008 | Klingberg et al. |
| 7,423,477 | B2 | 9/2008 | Sorrells et al. |
| 7,440,733 | B2 | 10/2008 | Maslennikov et al. |
| 7,469,017 | B2 | 12/2008 | Granstrom et al. |
| 7,474,149 | B2 | 1/2009 | Snelgrove et al. |
| 7,482,869 | B2 | 1/2009 | Wilson |
| 7,505,747 | B2 | 3/2009 | Solum |
| 7,512,387 | B2 | 3/2009 | Glueck |
| 7,535,133 | B2 | 5/2009 | Perreault et al. |
| 7,555,059 | B2 | 6/2009 | Rybicki et al. |
| 7,583,149 | B2 | 9/2009 | Funaki et al. |
| 7,589,605 | B2 | 9/2009 | Perreault et al. |
| 7,705,681 | B2 | 4/2010 | Ilkov |
| 7,715,811 | B2 | 5/2010 | Kenington |
| 7,889,519 | B2 | 2/2011 | Perreault et al. |
| 7,956,572 | B2 | 6/2011 | Zane et al. |
| 7,962,111 | B2 | 6/2011 | Solum |
| 8,009,765 | B2 | 8/2011 | Ahmed et al. |
| 8,026,763 | B2 | 9/2011 | Dawson et al. |
| 8,072,264 | B2 | 12/2011 | Gustavsson |
| 8,155,237 | B2 | 4/2012 | Ahmed |
| 8,164,384 | B2 | 4/2012 | Dawson et al. |
| 8,174,322 | B2 | 5/2012 | Heijden et al. |
| 8,212,541 | B2 | 7/2012 | Perreault et al. |
| 8,315,578 | B2 | 11/2012 | Zhu et al. |
| 8,340,606 | B2 | 12/2012 | Park et al. |
| 8,416,018 | B2 | 4/2013 | Yamauchi et al. |
| 8,447,245 | B2 | 5/2013 | Staudinger et al. |
| 8,451,053 | B2 | 5/2013 | Perreault et al. |
| 8,493,142 | B2 | 7/2013 | Tadano |
| 8,536,940 | B2 | 9/2013 | Bohn et al. |
| 8,542,061 | B2 | 9/2013 | Levesque et al. |
| 8,610,499 | B2 | 12/2013 | Royer |
| 8,611,459 | B2 | 12/2013 | McCallister |
| 8,643,347 | B2 | 2/2014 | Giuliano et al. |
| 8,659,353 | B2 | 2/2014 | Dawson et al. |
| 8,699,248 | B2 | 4/2014 | Giuliano et al. |
| 8,718,188 | B2 | 5/2014 | Balteanu et al. |
| 8,773,201 | B2 | 7/2014 | Yamamoto et al. |
| 8,824,978 | B2 | 9/2014 | Briffa et al. |
| 8,829,993 | B2 | 9/2014 | Briffa et al. |
| 8,830,709 | B2 | 9/2014 | Perreault et al. |
| 8,830,710 | B2 | 9/2014 | Perreault et al. |
| 8,957,727 | B2 | 2/2015 | Dawson et al. |
| 8,995,502 | B1 | 3/2015 | Lai et al. |
| 9,020,453 | B2 | 4/2015 | Briffa et al. |
| 9,048,727 | B2 | 6/2015 | Giuliano et al. |
| 9,141,832 | B2 | 9/2015 | Perreault et al. |
| 9,160,287 | B2 | 10/2015 | Briffa et al. |
| 9,166,536 | B2 | 10/2015 | Briffa et al. |
| 9,172,336 | B2 | 10/2015 | Briffa et al. |
| 9,209,758 | B2 | 12/2015 | Briffa et al. |
| 2003/0146791 | A1 | 8/2003 | Shvarts et al. |
| 2004/0100323 | A1 | 5/2004 | Khanifar et al. |
| 2004/0251964 | A1 | 12/2004 | Weldon |
| 2005/0062529 | A1 | 3/2005 | Gan et al. |
| 2005/0191975 | A1 | 9/2005 | Talwalkar et al. |
| 2005/0191976 | A1 | 9/2005 | Shakeshaft et al. |
| 2005/0248401 | A1 | 11/2005 | Hellberg et al. |
| 2005/0286278 | A1 | 12/2005 | Perreault et al. |
| 2007/0066224 | A1 | 3/2007 | d'Hont et al. |
| 2007/0066250 | A1 | 3/2007 | Takahashi et al. |
| 2007/0069818 | A1 | 3/2007 | Bhatti et al. |
| 2007/0123184 | A1 | 5/2007 | Nesimoglu et al. |
| 2007/0146090 | A1 | 6/2007 | Carey et al. |
| 2007/0159257 | A1 | 7/2007 | Lee et al. |
| 2007/0247222 | A1 | 10/2007 | Sorrells et al. |
| 2007/0247253 | A1 | 10/2007 | Carey et al. |
| 2007/0281635 | A1 | 12/2007 | McCallister et al. |
| 2007/0290747 | A1 | 12/2007 | Traylor et al. |
| 2007/0291718 | A1 | 12/2007 | Chan et al. |
| 2008/0001660 | A1 | 1/2008 | Rasmussen |
| 2008/0003960 | A1 | 1/2008 | Zolfaghari |
| 2008/0003962 | A1 | 1/2008 | Ngai |
| 2008/0007333 | A1 | 1/2008 | Lee et al. |
| 2008/0012637 | A1 | 1/2008 | Aridas et al. |
| 2008/0019459 | A1 | 1/2008 | Chen et al. |
| 2008/0085684 | A1 | 4/2008 | Phillips et al. |
| 2008/0146171 | A1 | 6/2008 | Hellberg et al. |
| 2008/0297246 | A1 | 12/2008 | Taylor |
| 2010/0073084 | A1 | 3/2010 | Hur et al. |
| 2010/0120384 | A1 | 5/2010 | Pennec |
| 2010/0201441 | A1 | 8/2010 | Gustavsson |
| 2011/0135035 | A1 | 6/2011 | Bose et al. |
| 2011/0156815 | A1 | 6/2011 | Kim et al. |
| 2011/0227770 | A1* | 9/2011 | Kaper ................ H03M 1/1052 341/120 |
| 2011/0309679 | A1 | 12/2011 | Fisher et al. |
| 2012/0032739 | A1* | 2/2012 | Peroulas ............. H03F 1/3247 330/149 |
| 2012/0235736 | A1 | 9/2012 | Levesque et al. |
| 2012/0252382 | A1 | 10/2012 | Bashir et al. |
| 2012/0256686 | A1 | 10/2012 | Royer |
| 2013/0114762 | A1* | 5/2013 | Azadet .................. H04L 1/0054 375/296 |
| 2013/0136039 | A1* | 5/2013 | Sturkovich ............. H04L 5/143 370/280 |
| 2013/0251066 | A1 | 9/2013 | Kim et al. |
| 2013/0307618 | A1* | 11/2013 | Anvari ................. H03F 1/3247 330/149 |
| 2014/0120854 | A1* | 5/2014 | Briffa ................... H03G 3/3042 455/127.3 |
| 2014/0167513 | A1 | 6/2014 | Chang et al. |
| 2014/0254716 | A1* | 9/2014 | Zhou .................... H03F 1/3247 375/296 |
| 2014/0313781 | A1 | 10/2014 | Perreault et al. |
| 2014/0339918 | A1 | 11/2014 | Perreault et al. |
| 2014/0355322 | A1 | 12/2014 | Perreault et al. |
| 2015/0023063 | A1 | 1/2015 | Perreault et al. |
| 2015/0054588 | A1* | 2/2015 | Wimpenny ........... H03F 1/0227 330/297 |
| 2015/0084701 | A1* | 3/2015 | Perreault ................ H03F 3/193 330/297 |
| 2015/0145604 | A1* | 5/2015 | Scott .................... H03F 1/0272 330/296 |
| 2015/0155895 | A1* | 6/2015 | Perreault ............. H04B 1/0458 455/127.3 |
| 2015/0171768 | A1 | 6/2015 | Perreault |
| 2015/0188448 | A1 | 7/2015 | Perreault et al. |
| 2015/0194989 | A1* | 7/2015 | Mkadem ............. H03F 1/3247 375/297 |
| 2015/0295497 | A1 | 10/2015 | Perreault et al. |
| 2015/0357912 | A1 | 12/2015 | Perreault et al. |
| 2015/0372646 | A1* | 12/2015 | Briffa ..................... H03F 1/025 330/297 |

(56) References Cited

U.S. PATENT DOCUMENTS

| | | | |
|---|---|---|---|
| 2016/0006365 | A1 | 1/2016 | Perreault et al. |
| 2016/0373067 | A1* | 12/2016 | Woo ..................... H03F 1/0222 |

FOREIGN PATENT DOCUMENTS

| | | |
|---|---|---|
| EP | 1 609 239 B1 | 7/2010 |
| WO | WO 2005/106613 A1 | 11/2005 |
| WO | WO 2006/119362 A2 | 11/2006 |
| WO | WO 2007/082090 A2 | 7/2007 |
| WO | WO 2007/094921 A1 | 8/2007 |
| WO | WO 2007/136919 A2 | 11/2007 |
| WO | WO 2007/136919 A3 | 11/2007 |
| WO | 2009/153218 A1 | 12/2009 |
| WO | WO 2010/056646 A1 | 5/2010 |
| WO | WO 2011/097387 A1 | 8/2011 |
| WO | WO 2013/109719 A1 | 7/2013 |
| WO | WO 2013/109743 A2 | 7/2013 |
| WO | WO 2013/109797 A1 | 7/2013 |
| WO | WO 2013/134573 A1 | 9/2013 |
| WO | WO 2013/191757 A1 | 12/2013 |
| WO | WO 2014/004241 A2 | 1/2014 |
| WO | WO 2014/028441 A2 | 2/2014 |
| WO | WO 2014/070474 A1 | 5/2014 |
| WO | WO 2014/070475 A1 | 5/2014 |
| WO | WO 2014/070998 A1 | 5/2014 |
| WO | WO 2014/085097 A1 | 6/2014 |

OTHER PUBLICATIONS

D. Diaz, et al., "Comparison of Two Different Cell Topologies for a Multilevel Power Supply to Achieve High Efficiency Envelope Amplifier", IEEE, 2009, pp. 25-30; 6 pages.

M. Rodriguez, et al., "Multilevel Converter for Envelope Tracking in RF Power Amplifiers", IEEE, 2009, pp. 503-510; 8 pages.

Yuan-Jyue Chen, et al., "Multilevel LINC System Design for Wireless Transmitters", IEEE, 2007, pp. 1-4.; 4 pages.

Jinsung Choi, et al., "A ΔΣ-Digitized Polar RF Transmitter", IEEE Transactions on Microwave Theory and Techniques, vol. 55, No. 12, Dec. 2007, pp. 2679-2690; 12 pages.

Kai-Yuan Jheng, et. al., "Multilevel LINC System Design for Power Efficiency Enhancement", IEEE, 2007, pp. 31-34; 4 pages.

Kevin Tom, et al., "Load-Pull Analysis of Outphasing Class-E Power Amplifier", The $2^{nd}$ International Conference on Wireless Broadband and Ultra Wideband Communications (AusWireless 2007), IEEE, 2007, pp. 1-4; 4 pages.

Surya Musunuri, et al., "Improvement of Light-Load Efficiency Using Width-Switching Dcheme for CMOS Transistors", IEEE Power Electronics Letters, vol. 3, No. 3, Sep. 2005, pp. 105-110; 6 pages.

Petri Eloranta, et al., "A Multimode Transmitter in 0.13 μm CMOS Using Direct-Digital RF Modulator", IEEE Journal of Solid-State Circuits, vol. 42, No. 12, Dec. 2007, pp. 2774-2784; 11 pages.

Beltran, et al.; "HF Outphasing Transmitter Using Class-E Power Amplifiers;" Microwave Symposium Digest, IEEE; Jun. 2009, pp. 757-760; 4 pages.

Bifrane, et al.; "On the Linearity and Efficiency of Outphasing Microwave Amplifiers;" IEEE Transactions on Microwave Theory and Techniques; vol. 52; No. 7; Jul. 2004; pp. 1702-1708; 7 pages.

Chen, et al.; "A High Efficiency Outphasing Transmitter Structure for Wireless Communications;" Digital Signal Processing Workshop, IEEE; Jan. 2009, pp. 348-352; 5 pages.

Chireix; "High Power Outphasing Modulation;" Proceedings of the Institute of Radio Engineers; vol. 23; No. 11; Nov. 1935; pp. 1370-1392; 23 pages.

Cox; "Linear Amplification with Nonlinear Components;" IEEE Transactions on Communications; Dec. 1974; pp. 1942-1945; 4 pages.

Cripps; "RF Power Amplifier for Wireless Communications, $2^{nd}$ Ed.;" Chapter 14, Artech House, Boston, MA; Jan. 2006; 23 pages.

El-Hamamsy; "Design of High-Efficiency RF Class-D Power Amplifier;" IEEE Transactions on Power Electronics; vol. 9; No. 3; May 1994; pp. 297-308; 12 pages.

Eun, et al.; "A High Linearity Chireix Outphasing Power Amplifier Using Composite Right/Left-Handed Transmission Lines;" Proceedings of the $37^{th}$ European Microwave Conference; Oct. 2007; pp. 1622-1625; 4 pages.

Everitt, et al.; "*Communication Engineering*;" $3^{rd}$ Edition. Chapter 11, pp. 403-450, New York: McGraw-Hill, 1956; 25 pages.

Gerhard, et al.; "Improved Design of Outphasing Power Amplifier Combiners;" 2009 German Microwave Conference; Mar. 2009; pp. 1-4; 4 pages.

Godoy, et al.; "Outphasing Energy Recovery Amplifier With Resistance Compression for Improved Efficiency;" IEEE Transactions on Microwave Theory and Techniques; vol. 57; No. 12; Dec. 2009; pp. 2895-2906; 12 pages.

Godoy, et al.; "A 2.4-GHz, 27-dBm Asymmetric Multilevel Outphasing Power Amplifier in 65-nm CMOS;" IEEE Journal of Solid-State Circuits; vol. 47; No. 10; Oct. 2012; pp. 2372-2384; 13 pages.

Hakala, et al., "A 2.14-GHz Chireix Outphasing Transmitter;" IEEE Transactions on Microwave Theory and Techniques; vol. 53; No. 6; Jun. 2005; pp. 2129-2138; 10 pages.

Hakala, et al.; Chireix Power Combining with Saturated Class-B Power Amplifiers; $12^{th}$ GAAS Symposium; Oct. 2004, pp. 379-382; 4 pages.

Hamill; "Impedance Pian Analysis of Class DE Amplifier;" Electronics Letters; vol. 30; No. 23; Nov. 10, 1994; pp. 1905-1906; 2 pages.

Hamill; "Time Reversal Duality Between Linear Networks;" IEEE Transactions on Circuits and Systems—I: Fundamental Theory and Applications; vol. 43; No, 1; Jan. 1996; pp. 63-65; 3 pages.

Hamill; "Time Reversal Duality in Dc-Dc Converters;" Power Electronics Specialists Conference, IEEE: vol. 1; Jun. 1997; 7 pages.

Han, et al.; "Analysis and Design of High Efficiency Matching Networks;" IEEE Transactions on Power Electronics; vol. 21; No. 5, Sep. 2006; pp. 1484-1491; 8 pages.

Han, et al.; "Resistance Compression Networks for Radio-Frequency Power Conversion;" IEEE Transactions on Power Electronics; vol. 22; No. 1; Jan. 2007; pp. 41-53; 13 pages.

Heijden, et al.; "A 19W High-Efficiency Wide-Band CMOS-GaN Class-E Chireix RF Outphasing Power Amplifier" Microwave Symposium Digest (MMT), 2011 IEEE MTT-S International; Jun. 5-10, 2011; 4 pages.

Honjo; "A Sim Circuit Synthesis Method for Microwave Class-F Ultra-High-Efficency Amplifiers with Reactance-Compensaton Circuits;" Solid-State Eleotronics 44; Feb. 2000; pp. 1477-1482; 6 pages.

Hur, et al.; "A Multi-Level and Multi-Band Class-D CMOS Power Amplifier for the LINC System in the Cognitive Radio Applicaton;" IEEE Microwave and Wireless Components Letters; vol. 20; issue 6; Jun. 2010; pp. 1-3; 3 pages.

Hur, et al.; "Highiy Efficient and Linear Level Shifting Digital LINC Transmitter with a Phase Offset Cancellation;" Radio & Wireless Symposium; Jan. 2009; pp. 211-214; 4 pages.

Hur, et al.; "Highly Efficient Uneven Multi-Level LINC Transmitter;" Electronics Letters; Jul. 30, 2009; vol. 45; No. 16; 2 pages.

Kee, et al.; "The Class-E/F Family of ZVS Switching Amplifiers;" IEEE Transactions on Microwave Theory and Techniques; vol. 51; No. 6; Jun. 2003; pp. 1677-1690; 14 pages.

Krauss, et al.; *Soild State Radio Engineering*; Chapter 14, New York: Wiley, 1980; 23 pages.

Langridge, et al.; "A Power Re-Use Technique for Improved Efficiency of Outphasing Microwave Power Amplifiers;" IEEE Transactions on Microwave Theory and Techniques; vol. 47; No. 8; Aug. 1999; pp. 1467-1470; 4 pages.

Lee; "*Planer Microwave Engineering*;" Chapter 20, pp. 630-687, New York: Cambridge University Press, 2004: 58 pages.

U.S. Appl. No. 14/911,599, filed Feb. 11, 2016, Chandrakasan, et al.
U.S. Appl. No. 14/911,774, filed Feb. 12, 2016, Chen, et al.
U.S. Appl. No. 14/920,031, filed Oct. 22, 2015, Briffa, et al.
U.S. Appl. No. 14/968,045, filed Dec. 14, 2015, Perreault, et al.

(56) References Cited

OTHER PUBLICATIONS

U.S. Appl. No. 14/974,563, filed Dec. 18, 2015, Perreault, et al.
U.S. Appl. No. 14/975,742, filed Dec. 19, 2015, Perreault, et al.
Lepin, et al.; "L-Band LDMOS Power Amplifiers Based on an Inverse Gass-F Architecture;" IEEE Transactions on Microwave Theory and Techniques; vol. 53; No. 6; Jun. 2005; pp. 2007-2012; 6 pages.
Ni, et al.; "A New Impedance Match Method in Serial Chireix Combiner;" 2008 Asia-Pacific Microwave Conference; Dec. 2008; pp. 1-4; 4 pages.
Perreaultl; A New Power Combining and Outphasing Modulation System for High-Efficiency Power Amplification; Circuit and Systems (MWSCAS), 53$^{rd}$ IEEE, International Midwest Symposium; Aug. 2010; pp. 1-14, 14 pages.
Phinney, et al.; "Radio-Frequency Inverters with Transmission-Line Input Networks;" IEEE Transactions on Power Electronics; vol. 22; No. 4; Jul. 2007; pp. 1154-1161; 8 pages.
Qureshi, et al.; "A 90-W Peak Power GaN Outphasing Amplifier with Optimum Input Signal Conditioning;" IEEE Transactions on Microwave Theory and Techniques; vol. 57; No. 8; Aug. 2009; pp. 1925-1935; 11 pages.
Raab: "Class-F Power Amplifiers with Maximally Flat Waveforms;" IEEE Transactions on Microwave Theory and Techniques; vol. 45; No. 11; Nov. 1997; pp. 2007-2012; 6 pages.
Raab; "Efficiency of Outphasing RF Power-Amplifier Systems;" IEEE Transactions on Communications; vol. Com-33; No. 10; Oct. 1985; pp. 1094-1099; 6 pages.
Raab, et al.; "RF and Microwave Power Amplifier and Transmitter Technologies—Part 3;" High Frequency Electronics; Sep. 2003; pp. 34-48; 9 pages.
Raab; "Average Efficiency of Class-G Power Amplifiers;" IEEE Transactions on Consumer Electronics; vol. CE-32; No. 2; May 1986; pp. 145-150; 6 pages.
Rivas, et al.; "A High-Frequency Resonant Inverter Topology with Low-Voltage Stress;" IEEE. Transactions on Power Electronics; vol. 23; No. 4; Jul. 2008; pp. 1759-1771; 13 pages.
Shirvani, et al.; "A CMOS RF Power Amplifier With Parallel Amplification for Efficient Power Control;" IEEE Journal of Solid-State Circuits; vol. 37; No. 6; Jun. 2002; pp. 684-693; 10 pages,
Sokal, et al.; "Class E—A New Class of High-Efficiency Tuned Single-Ended Switching Power Amplifiers;" IEEE Journal of Solid-State Circuits; vol. SC-10; No. 3; Jun. 1975; pp. 168-176; 9 pages.
Sokal; "Class-E RF Power Amplifiers;" QEX; Jan./Feb. 2001; pp. 9-20; 12 pages.
Vasic, et al.; "Multileverl Power Supply for High Efficiency RF Amplifiers;" 2009 IEEE Applied Power Electronics Conference; pp. 1233-1238; 6 pages; Feb. 2009.
Walling, et al.; "A Class-G Supply Modulator and Class-E PA in 130 nm CMOS;" IEEE Journal of Solid-State Circuits; vol. 44; No. 9; Sep. 2009; pp. 2339-2347; 9 pages.
Yao, et al.; "Power Amplifier Selection for LINC Applications;" IEEE Transactions on Circuits and Systems-II: Express Briefs; vol. 53; No. 8; Aug. 2006; pp. 763-767; 5 pages.
Zhang, et al.; "Analysis of Power Recycling Techniques for RF and Microwave Outphasing Power Amplifiers;" IEEE Transactions on Circuits and Systems-II: Analog and Digital Signal Processing; vol. 49; No. 5; May 2002; pp. 312-320; 9 pages.
Zhou, et al.; "A Distributed Active Transformer Coupled Outphasing Power Combinver;" IEEE Microwave Conference; Dec. 2009; pp. 2565-2568; 4 pages.
Zhukov, et al.; "Push-pull switching oscillator without commutating losses;" Poluprovodnikovye Pribory v. Tekhnike Elektrosvyazi, No. 15, Jan. 1975, 8 pages.
Xu, et al.; "A 28.1dBm class-D outphasing power amplifier in 45nm LP digital CMOS;" Symposium on VLSI Circuits Digest of Technical Papers; Jun. 16, 2009; pp. 206-207; 2 pages.
Yan, et al.; "A High Efficiency 780 MHz GaN Envelope Tracking Power Amplifier," 2012 Compound Semiconductor Integrated Circuits Symposium; Oct. 2012; pp. 1-4; 4 pages.
Yousefzadeh, et al.; "Three-Level Buck Converter for Envelope Tracking Applications;" IEEE Transactions on Power Electronics; vol. 21; No. 2; Mar. 2006; pp. 549-552; 4 pages.

* cited by examiner

100

DIGITAL PRE-DISTORTION (DPD) TRAINING AND CALIBRATION SYSTEM AND RELATED TECHNIQUES

CROSS-REFERENCE TO RELATED APPLICATIONS

This application claims the benefit under 35 U.S.C. § 119(e) of U.S. provisional application No. 62/126,949, filed on Mar. 2, 2015, which is hereby incorporated herein by reference in its entirety.

BACKGROUND

In many applications, it is desirable for radio frequency (RF) transmit systems to meet spectral performance, out-of-band emissions, and error vector magnitude (EVM), as well as other requirements, starting from an initial power on of the RF transmit system. It is further desirable for RF transmit systems to achieve both high efficiency (e.g., low power consumption) and high signal integrity. One means of improving efficiency in such systems is to utilize an architecture in which an RF power amplifier (PA) of the RF system is switched among a set of operating states. For example, some systems might select (e.g., via switches) a bias voltage of the PAs (e.g. a drain or gate bias voltage of a field effect transistor) in the RF transmit system from among multiple different supply voltages.

Digital pre-distortion (DPD) is sometimes employed to help ensure signal integrity of a signal being transmitted by an RF transmit system while at the same time reducing power consumption of the RF transmit system.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In accordance with the concepts, systems, circuits and techniques described herein, it has been recognized that DPD techniques might employ information provided by an observation receiver, when possible, to adapt DPD values to account for various operating conditions and operating characteristics in an RF transmit system. Such operating conditions may include, but are not limited to, to process, voltage and temperature variations (collectively, such variations might be referred to as "process, voltage and temperature (PVT) variations), the use of different transmission bands, different bandwidths, temperature (or changes in temperature), use of different carrier frequencies, voltage (or changes in voltage), humidity (or changes in humidity), RF amplifier load impedances, changes in RF amplifier load impedances and frequency of operation. Changes in such operating conditions might result from variations in operating characteristics of electronic components of the RF transmit system (e.g., voltages, component tolerances, aging, etc.), variations in environmental conditions in which the RF transmit system operates, and variations in component and system manufacturing processes. Changes or variation in one or more operating conditions may give rise to changes or variation in one or more operating characteristics of the RF transmit system.

Heretofore, the more aggressively power consumption of the RF transmit system is reduced, the more likely the RF transmit system will experience a decrease in signal integrity due to one or more operating conditions.

In accordance with the concepts, systems, circuits and techniques described herein, however, a DPD adaptation or training system enables RF transmit systems to aggressively reduce power consumption of the RF transmit system without a concomitant decrease in signal integrity due to one or more operating conditions. Such systems find application in a variety of applications including but not limited to wireless transmit and receive systems (e.g. cell phone base stations and handsets).

Described embodiments are generally directed toward a radio frequency (RF) transmit system including an observation receiver coupled to receive a portion of an RF signal propagating along an RF transmit signal path and a digital pre-distortion (DPD) system coupled to the observation receiver and configured to receive one or more signals from the observation receiver and in response thereto, to adapt one or more DPD values of the RF transmit system over a period of time and a range of operating conditions of the RF transmit system and to provide one or more adapted DPD values to said controller.

BRIEF DESCRIPTION OF THE DRAWING FIGURES

Other aspects, features, and advantages of the concepts, systems and techniques will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1:
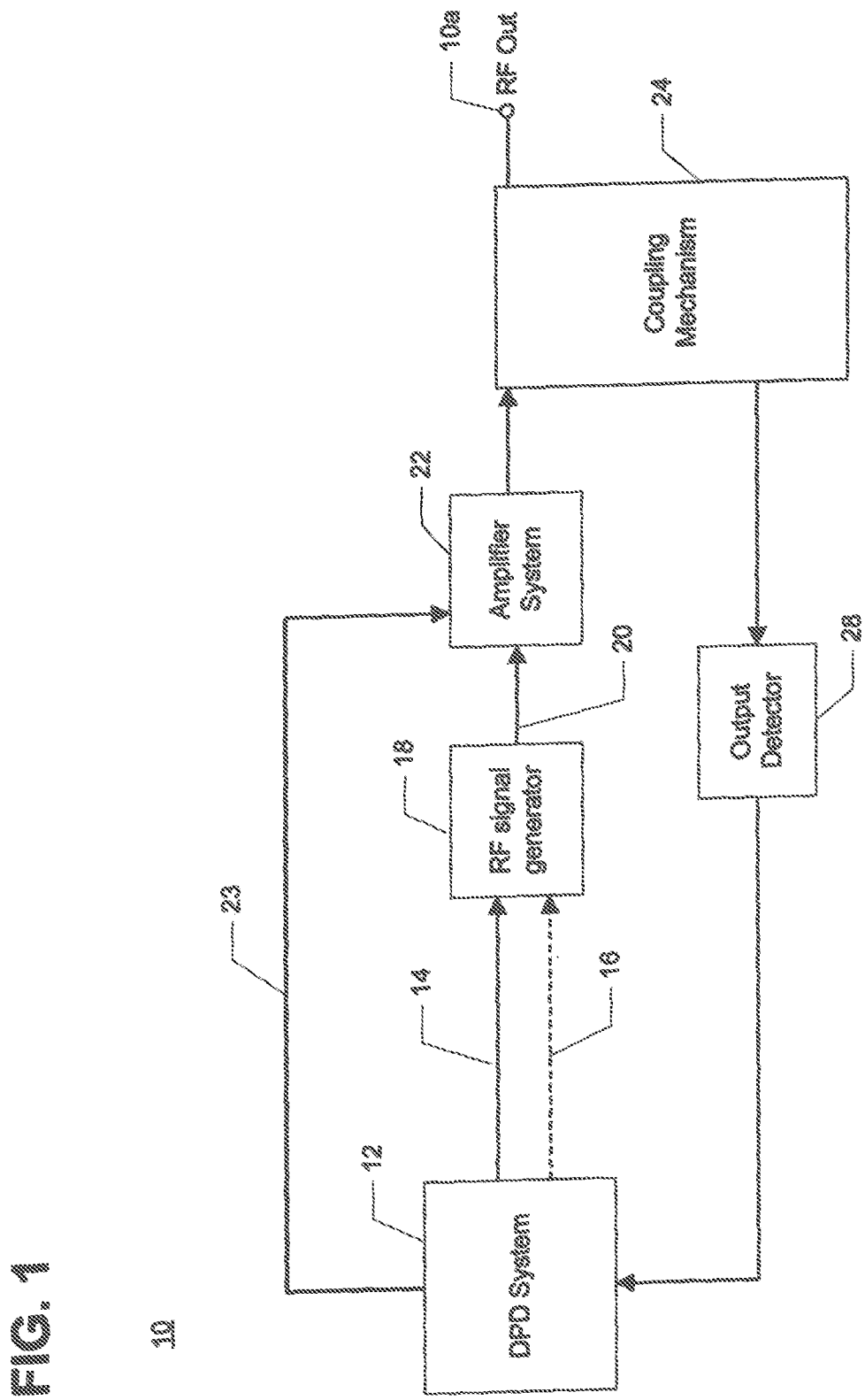
FIG. 1 is a block diagram of a radio frequency (RF) transmit system utilizing conservative digital predistortion (DPD) values upon initial system startup.

Described herein are concepts, systems, circuits and techniques for achieving a high degree of linearity and low noise in switched-state amplifier systems (e.g. switched-state power amplifier systems), and for enabling radio frequency (RF) transmit systems to address one or more of a wide variety of different operating conditions. Such operating conditions may include, but are not limited to, PVT variations, the use of different transmission bands, different bandwidths, temperature (or changes in temperature), use of different carrier frequencies, voltage (or changes in voltage), humidity (or changes in humidity), RF amplifier load impedances, changes in RF amplifier load impedances and frequency of operation.

To prevent performance degradation of RF transmit systems resultant from process, voltage and temperature (PVT)

variations in component and system characteristics or other operating conditions, digital pre-distortion (DPD) systems operating in accordance with the concepts described herein utilize one or more initial predetermined DPD values to ensure that the RF transmit system operates with a predetermined signal integrity which at least meets a minimum desired performance requirement over a predetermined frequency band (e.g. a middle, low extreme and high extreme of a desired frequency band). Such systems may also store and/or adapt values in DPD tables to achieve high efficiency performance of a radio frequency (RF) transmit system while ensuring that the RF transmit system rarely, and ideally, never, loses signal integrity (i.e. the system accurately reproduces an original signal).

Thus, systems provided in accordance with the concepts described herein have lower power consumption for a given output power as compared to prior art systems. The systems and techniques described herein also enable dynamic improvement of efficiency in an RF transmit system (i.e. efficiency can be improved "on-the-fly" during operation of the RF transmit system by generation and/or storage of appropriate DPD values).

For example, in described embodiments, when the RF transmitter is first powered for operation, the DPD table is pre-loaded with values selected to ensure that the RF transmit system meets performance and signal integrity requirements with considerable margin regardless of PVT variations or other operating conditions. Such values are thus referred to herein as "conservative" DPD values. Consequently, at an initial powering of the RF transmit system, the efficiency of an RF amplifier (e.g. an RF power amplifier) included in the RF transmit system (and possibly the entire RF transmit system) may be correspondingly low. In such a state, however, the RF transmit system substantially satisfies all other performance metrics regardless of PVT variations or other operating conditions.

Over time, data is collected from an observation receiver or other detector that might be included in some embodiments of the RF transmit system. The collected data is used to build or otherwise provide one or more DPD tables (or "mappings") for the various conditions (e.g., PVT variations or other operating conditions) encountered by the RF transmit system. The collected data may be used to train the DPD system by adapting or updating DPD values such that as the amount of data collected increases, some or all of the DPD values stored in the DPD table ideally converge toward a value (or a range of values) which ideally results in improved performance of the RF transmit system. The set of converged (or adapted) DPD values result in efficient performance of the RF transmit system while also maintaining a high degree of signal integrity relative to systems which use static DPD values.

While the values stored in the DPD tables evolve (e.g. are changed and/or adapted to converge on a set of values that result in high efficiency and high signal integrity operation of the RF transmit system), an RF amplifier (e.g. an RF power amplifier) included as part of the RF transmit system will operate increasingly nonlinearly (e.g. the RF amplifier will operate in its so-called "non-linear region"). Thus, over time, the RF transmit system becomes increasingly power-efficient without requiring factory calibration and quality control of the RF transmit system or of individual components included in the RF transmit system.

Accordingly, described embodiments using the concepts, systems, circuits and techniques described herein provide a DPD training and calibration system and related techniques for use with RF transmit systems and RF amplifiers (e.g. RF power amplifiers) using continuous supply (i.e. analog) modulation, discrete supply modulation or a combination of both analog and discrete supply modulation. Such RF amplifiers might commonly be employed, for example, in "class G" amplifiers, a Multi-level Linear amplifier with Nonlinear Components (MLINC), Asymmetric Multilevel Outphasing (AMO) amplifiers, and Multilevel Backoff (MBO) amplifiers including Asymmetric Multilevel BackOff (AMBO) amplifiers.

Referring now to FIG. 1, an illustrative RF transmit system 10 includes a DPD system 12 which provides data signals and optionally, one or more control signals along respective ones of data paths 14, 16 to respective inputs of an RF signal generator 18 and along data path 23 to an input of an RF amplifier system 22. In some embodiments, data signals and control signals may be provided via a single data path between DPD system 12 and RF signal generator 18. It should be appreciated that control signals might control a phase and amplitude of RF signals generated by RF signal generator 18, or select which ones of local frequencies are employed to generate a modulated RF signal.

As will become apparent from the description herein below, DPD system 12 has stored therein one or more initial DPD values selected to ensure that the RF transmit system operates with a signal integrity which meets a minimum desired performance criteria upon initial power up of the RF transmit system (hence, such initial DPD values are sometimes referred to herein as "conservative DPD values" or more simply "conservative values"). Thus, the initial DPD values are used by the RF amplifier system 22 and the use of such initial DPD values enable the RF transmit system 10 to operate at a predetermined power efficiency level and a predetermined signal integrity over a desired frequency band even upon initial start up (or power up) of the RF transmit system).

The requirements for a predetermined signal integrity may be set by a user, system designer or a third party (e.g. a Standards Group). Accordingly, the one or more initial DPD values enable operation of the RF transmit system at a predetermined, desired power efficiency level and a predetermined desired signal integrity level which meets or exceeds specified operational requirements at middle, low and high portions of a desired RF frequency band.

Accordingly, in response to the data and/or control signals provided thereto, RF signal generator 18 generates an RF signal at an output thereof. The output of RF signal generator 18 is coupled via a signal path 20 to an input of an RF amplifier system 22. RF amplifier system 22 may be provided as any type of RF amplification system, some examples of which are described herein below. Those of ordinary skill in the art will appreciate, of course, that any amplifying circuit, system or technique which satisfies the needs of a particular application may be used.

RF amplifier system 22 receives the RF signals provided thereto from RF signal generator 186 and provides amplified RF signals at an output thereof which subsequently propagate to output port 10a of RF transmit system 10.

A coupling mechanism 24 is disposed to couple or otherwise direct at least a portion of the RF signal propagating between the output of RF signal generator 20 and the output port 10a of the RF transmit system to DPD system 12. In preferred embodiments, coupling mechanism 24 couples or otherwise directs a portion of the RF signal after the output of RF amplifier system 22. Illustrative circuits and techniques for implementing coupling mechanism 24 are described herein below. Those of ordinary skill in the art will appreciate, of course, that any circuit or technique which satisfies the needs of a particular application may be used.

Appropriate circuitry with which to implement coupling mechanism 24 in-whole or in-part, includes but I not limited to any type of RF coupler, power divider, power director or any other circuitry known by those of ordinary skill in the art capable of directing or otherwise providing a portion of RF signal from the signal path to the detector (or directly to DPD system 12).

In some embodiments, system 10 may optionally include an output detector 28 coupled between coupling mechanism 24 and DPD system 12. Detector 28 is configured to receive signals from coupling mechanism 24 and to provide signals to DPD system 12. In some embodiments, detector 28 may be provided as a receiver such as an observation receiver.

In response to the signals provided thereto, DPD system 12 may adaptively adjust one or both of the driving signals of RF amplifier as well as the operation of RF amplifier system 22. Thus, coupling mechanism 24 provides feedback for adaptation of DPD values and/or linearization of the output of RF amplifier system 22. Such feedback control may be implemented in systems which utilize supply modulation. However, the techniques described herein are not limited to use with RF amplifier system which utilize supply modulation. Rather, the DPD conservative value and feedback concepts described herein find use in RF amplifier systems including, but not limited to, fixed power supply systems and supply modulation systems of any type.

Figure 2:
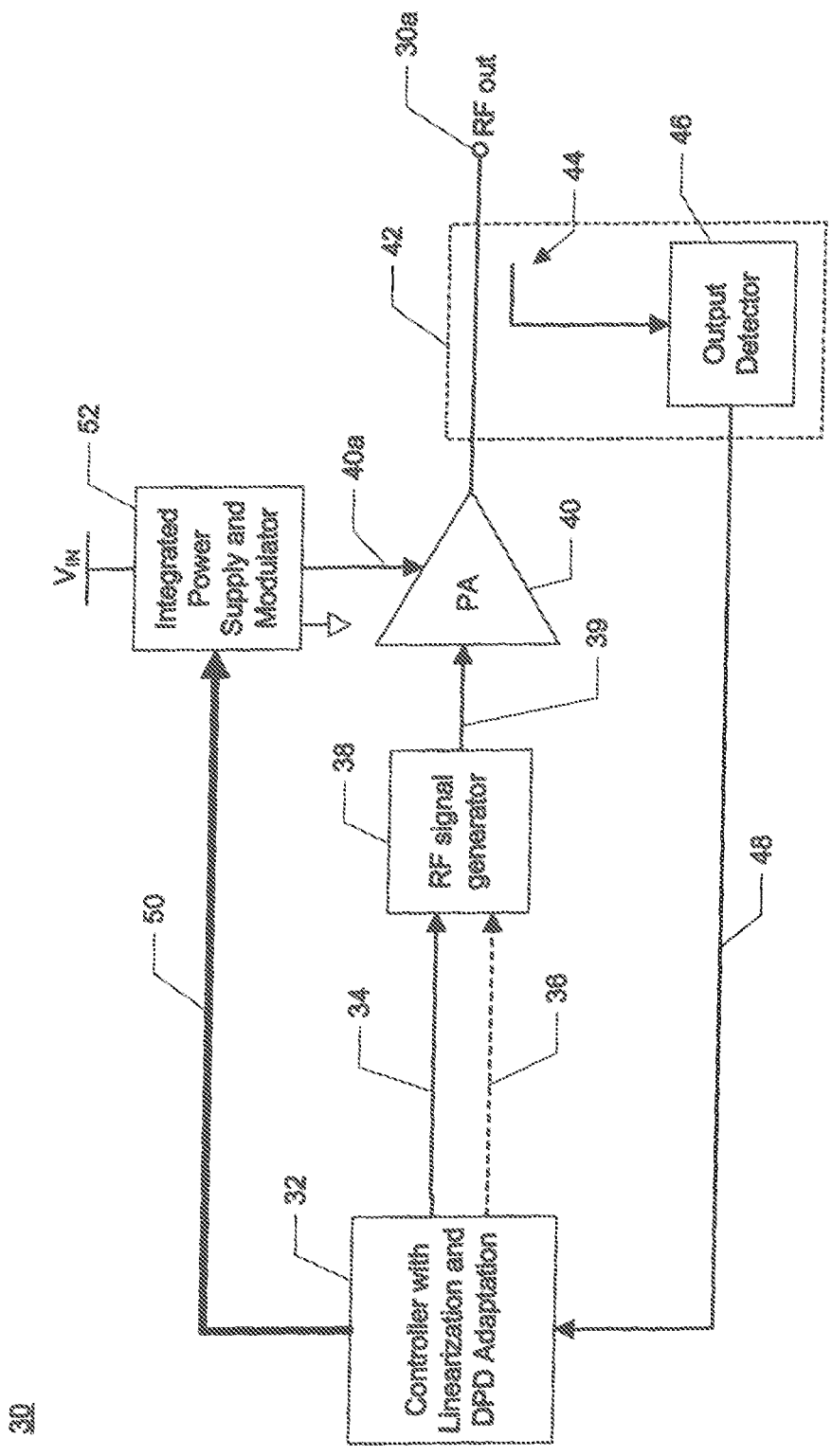
FIG. 2 is a block diagram of an RF transmit system having DPD adaptation.

Referring now to FIG. 2, an illustrative RF transmit system 30 includes a controller with linearization and DPD adaptation 32. The controller with linearization and DPD adaptation 32 provides data signals and optionally, one or more control signals along respective ones of data paths 34, 36 to respective inputs of an RF signal generator 38. It should be appreciated that control signals 36 might control a phase and amplitude of RF signals generated by RF signal generator 38, or select which ones of local frequencies are employed to generate a modulated RF signal along signal path 39.

In response to the data and/or control signals provided thereto, RF signal generator 38 generates an RF signal at an output thereof. The output of RF signal generator 38 is coupled via a signal path 39 to an input of an RF amplifier 40. RF amplifier 40 receives the RF signals provided thereto from RF signal generator 38 and provides amplified RF signals at an output thereof which subsequently propagate to port 30a of RF transmit system 30.

A sensing circuit 42 is disposed to couple or otherwise direct at least a portion of the RF signal propagating between the output of RF signal generator 38 and the output port 30a of the RF transmit system 30 to controller with linearization and DPD adaptation 32. In preferred embodiments, sensing circuit 42 couples or otherwise directs a portion of the RF signal after the output of RF amplifier 40. In the exemplary embodiment of FIG. 2, sensing circuit 42 includes circuitry 44 to couple or otherwise direct at least a portion of the RF signal propagating along RF signal path to a detector 46. Circuitry 44 may be provided, for example, as an RF coupler or any other circuitry known by those of ordinary skill in the art capable of directing or otherwise providing a portion of RF signal from the signal path to the detector. In some embodiments, circuitry 44 and output detector 46 may be the same as, or similar to, RF coupler 134 and observation receiver 116 described in conjunction with FIG. 3.

Detector 46 receives signals provided thereto from circuitry 44 and processes or otherwise operates on the signals to provide an appropriate signal to the controller with linearization and DPD adaptation 32.

In this illustrative embodiment, controller with linearization and DPD adaptation 32 receives the signals provided thereto from detector 46 and provides control signals along signal path 50 to an input of an integrated power supply and modulator 52. An output of integrated power supply and modulator 52 is coupled to a bias terminal 40a of RF amplifier 40 which may, for example, be provided as a power amplifier.

In operation, sensor 42 measures an RF signal (e.g. at a point after the output of amplifier 208) and provides an output information signal 48 to controller with linearization and DPD adaptation 32. In response to the signals provided thereto, controller with linearization and DPD adaptation 32 adaptively adjusts one or both of the driving signals of RF amplifier 40 (e.g., a modulated RF signal on signal path 39) as well as the operation of integrated power supply and modulator 52 (e.g., to linearize the output of RF amplifier 40).

In particular, the controller with linearization and DPD adaptation 32 receives signals via sensing circuit 42 and provides control signal(s) 50 to integrated power supply and modulator 52. Sensing circuit 42 provides feedback for adaptation of DPD values and/or linearization of the output of RF amplifier 40 by controller with linearization and DPD adaptation 32. Controller with linearization and DPD adaptation 32 may, for example, be used to implement the DPD techniques described herein by computing new and/or updated DPD values using signals provided from sensor 42 and polynomial functions, memory polynomial functions, etc.

Drive control of RF amplifier 40 (e.g., by a modulated RF signal) is coordinated with the control of integrated power supply and modulator 52 (e.g., amplifier bias signal which may correspond to a drain bias signal, for example) to provide a desired RF output (e.g., an RF output signal at port 30a).

RF amplifier 40 can be implemented as one of a variety of types of power amplifiers in various embodiments of RF transmit system 30. For example, RF amplifier 40 might be implemented as a single-transistor amplifier, a balanced amplifier, or a Doherty amplifier. Moreover, although for simplicity RF transmit system 30 is shown having a single RF amplifier 40, some embodiments might employ multiple RF amplifiers. For example, some embodiments might include two or more RF amplifiers with either common or different selectable drain voltages provided by integrated power supply and modulator 52. Similarly, the two or more RF amplifiers might have different drive inputs or a common drive input (e.g., modulated RF signal(s)) with an analog splitting network. In some embodiments, the outputs of the plurality of RF amplifiers are combined to a single output with either an isolating combiner or through a lossless combiner such as a Chireix combiner or multiway lossless combiner.

Other embodiments implement a multi-stage power amplifier (e.g., where one subset of RF amplifiers 40 serve as a driver stage for another subset of RF amplifiers 40) in which one or more RF amplifier stages are drain modulated by integrated power supply and modulator 52. In yet other embodiments, integrated power supply and modulator 52 might have multiple modulator outputs to independently drain modulate multiple RF amplifiers 40. In such embodiments, each RF amplifier might support separate RF outputs (e.g., for a Multiple-Input, Multiple-Output (MIMO) system or for a balanced power amplifier system utilizing multiple RF amplifiers) such that the RF amplifiers operate for different frequencies (or bands of frequencies), for transmit diversity, MIMO, or other purposes. Such techniques are found, for example, in co-pending application Ser. No. 14/920,031 filed Oct. 22, 2015 and assigned to the assignee of the present application.

Figure 3:
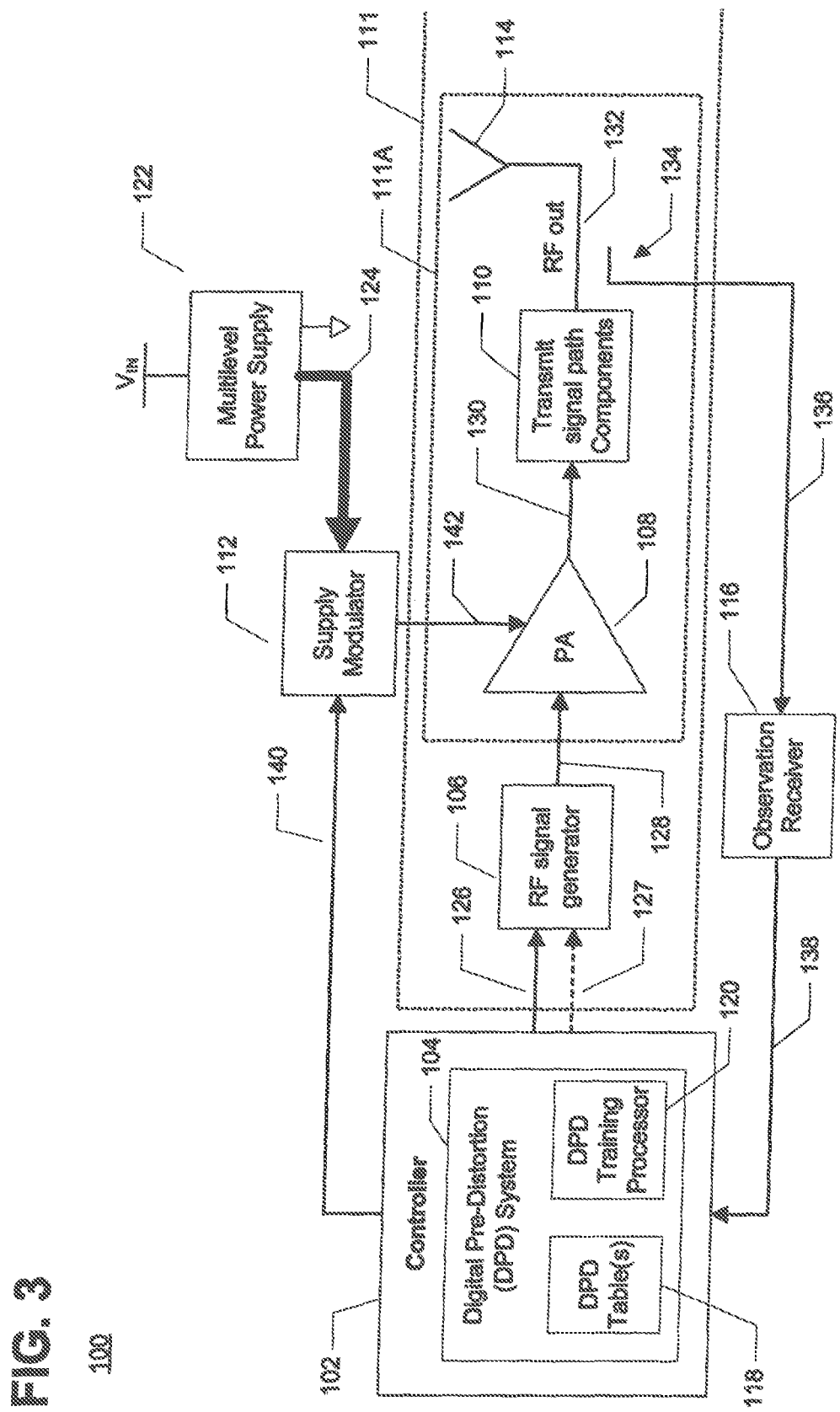
FIG. 3 is a block diagram of an RF transmit system that adapts digital pre-distortion (DPD) values to achieve a desired level of power efficiency and signal integrity in accordance with illustrative embodiments.

Referring now to FIG. 3, an illustrative RF transmit system 100 includes a controller 102. In this illustrative embodiment, controller 102 includes a digital pre-distortion (DPD) system 104. In some embodiments, DPD system 104 may be provided separate from controller 102. In some embodiments, RF transmit system 100 might include one or more of a baseband processor, an applications processor or any other type of suitable processor (including any specialized processors) to implement RF transmit system 100 and controller 102. In some embodiments, RF transmit system 100 might be implemented in a single integrated circuit (IC).

DPD system 104 includes one or more DPD tables 118 for storage of DPD values and/or DPD-related values and a DPD training system 120, the operation of which will be described in greater detail below. Alternatively, values may be dynamically computed (e.g. using various equations, including polynomial equations). Controller 102 provides data signal 126 and, optionally, one or more control signals 127, to a transmit signal path 111 which includes at least an RF signal generator 106, and an RF amplifier 108 which may, for example, be provided as a power amplifier (PA).

Transmit signal path 111 may also optionally include additional circuit components, herein collectively represented as transmit signal path components 110. Transmit signal path components 110 might include, for example, filters, diplexers, circulators, switches and any other suitable circuit component necessary for proper operation of RF transmit system 100. It should also be appreciated that such circuit components may be disposed anywhere along transmit signal path 111 (e.g. disposed either before or after RF signal generator 106 and/or before or after RF amplifier 108). Those of ordinary skill in the art will appreciate how to select and deploy various components in the transmit signal path.

RF signal generator 106 performs digital-to-RF modulation of data signal 126 (e.g., a digital baseband signal) with one or more local frequencies to provide modulated RF signal 128. The portion of the transmit signal path 111 along which RF signals propagate may be referred to as an RF transmit signal path portion 111a.

Control signals 127 provided to RF signal generator 106 may control a phase and/or amplitude of modulated RF signal 128 generated by RF signal generator 106, and/or select which ones of the local frequencies employed to generate modulated RF signal 128.

One or more RF amplifiers 108 (which may, for example, be provided as RF power amplifiers) receive modulated RF signal 128 and provide an amplified RF signal, here illustrated as RF out signal 132, to an input of antenna 114 for transmission.

RF amplifier 108 also receives a bias signal 142 (e.g. a drain bias signal) from supply modulator 112, which modulates (or selects) bias signal 142 from a plurality of voltages 124 provided by power supply 122. In preferred embodiments, bias signal 142 may be coupled to a drain terminal of one or more field effect transistors (FETS) arranged in an RF power amplifier. Voltage 122 may be provided as a discrete or continuous (e.g. analog) signal provided by power supply 122. Bias signal 142 is dynamically switched (e.g., modulated) among different power supply (e.g., voltage) levels by supply modulator 112 based, at least in part, upon charac-teristics of a signal to be transmitted (e.g., desired characteristics of RF out signal 132 to be transmitted via antenna 114).

For example, drain bias signal 142 might be a selected one of a plurality of fixed supply voltages, for example supply voltages generated by multilevel power supply 122, one of which is selected by supply modulator 112 based on control signals 140 from controller 102. Alternatively, bias signal 142 might be dynamically varied (e.g., if multilevel power supply 122 is a variable output supply). Thus, the bias voltage applied to RF amplifier 108 might be varied based upon characteristics of the signal to be transmitted, for example, a desired average power level during a particular time period. Other characteristics may, of course, also be used either in combination or in place of desired average power level during a particular time period. In some embodiments, supply modulator 112 might be implemented to provide continuous supply (e.g., analog) modulation, discrete-level supply modulation or a combination of both analog and discrete-level supply modulation in the final and/or driver stages of RF amplifier 108.

Controller 102 may also set the amplification provided by RF amplifier 108 and, thus, the RF output power of the system transmitted via antenna 114 (e.g., RF out signal 132). Controller 102 might continuously modulate the power supply level provided to RF amplifier 108, for example, based upon one or more samples of data signal 126 (e.g., one or more data samples of the baseband data signal to be transmitted). For example, controller 102 might adjust the power supply level of RF amplifier 108 based upon a window of N samples of data signal 126 and determine whether, for one or more of the samples in the window, the output power of the system (e.g., the power supply level of RF amplifier 108) should be adjusted.

In some embodiments, one of the plurality of discrete voltages 124 might be directly applied to RF amplifier 108 by supply modulator 112 (e.g., as drain bias signal 142), or might be filtered by a transition shaping filter (not shown in FIG. 3). The transition shaping filter removes undesired switching signal characteristics (e.g., sharp transition edges or other switching noise) to provide acceptable transitions among the power supply levels. For example, sharp transition edges or other noise present on the power supply input to the RF amplifier (which may be a power amplifier) might cross-coupled that switching noise into the RF output of the RF amplifier (e.g., into amplified RF signal 130). Such a transition shaping filter is described in co-pending U.S. application Ser. No. 14/934,760 filed Nov. 6, 2015, and assigned to the assignee of the present application, and hereby incorporated herein by reference in its entirety.

For simplicity, RF transmit system 100 is shown having a single RF amplifier 108 (e.g. a single power amplifier). However, some embodiments might employ multiple RF amplifiers (e.g. multiple power amplifiers). For example, in some embodiments of RF transmit system 100 that employ multiple RF amplifiers 108, transmit signal path 110 might include a power combiner to combine the RF outputs of the multiple RF amplifiers. In other embodiments employing multiple RF amplifiers, each RF amplifier might support separate RF outputs (e.g., for a Multiple-Input, Multiple-Output (MIMO) system or for a balanced power amplifier system utilizing multiple RF amplifiers). Such an arrangement is described in co-pending U.S. application Ser. No. 14/920,031 filed Oct. 22, 2015 and assigned to the assignee of the present application and incorporated herein by reference in its entirety. In yet other embodiments, one subset of RF amplifiers 108 might serve as a driver stage for another subset of RF amplifiers 108.

Multilevel power supply 122 might be powered from a single input, shown as voltage VIN, with the plurality of discrete voltages 124 generated in a variety of ways, for example, by employing a multi-output power supply or a multi-output magnetic converter (e.g., with multiple tapped inductors or multi-winding transformers), or employing multiple individual power supplies.

It is desirable to operate RF transmit system 100 to achieve highly power efficient performance while maintaining the signal integrity of the original transmit signal (e.g., data signal 126). One technique to achieve this is to use digital pre-distortion (DPD) system 104 to overcome any signal distortion of RF amplifier 108 while still achieving high power efficiency over different operating conditions associated with RF transmit system 100 (e.g., variations in circuit components of transmit signal path 110, etc.). In some embodiments, DPD system 104 includes a variety of DPD tables 118. Each DPD table 118 might be specialized to store DPD values corresponding to known scenarios or configurations of circuit components of RF transmit system 100 (e.g., to adjust for variations in circuit components of transmit signal path 110, etc.). In some embodiments, DPD system 104 includes an amplitude detector (not shown) that receives at least a portion of originating transmit signal (e.g., data signal 126) and assists in determining control signals (e.g., control signals 140) to provide to supply modulator 112.

For example, some embodiments may employ one DPD table corresponding to when transmit signal path 110 includes a duplexer manufactured by a first supplier, and another DPD table corresponding to when transmit signal path 110 includes a duplexer manufactured by a second supplier. Thus, the one or more DPD tables contain determined digital pre-distortion values used to assist in providing control signals (e.g., control signals 140) to supply modulator 112. Other embodiments might perform digital pre-distortion without employing DPD tables. For example, DPD values might be determined (e.g., calculated) using polynomial functions, memory polynomial functions, etc., without being stored in DPD tables.

RF transmit system 100 dynamically adjusts its power efficiency (e.g., the power efficiency of RF amplifier 108) "on-the-fly" during operation at a desired level of signal integrity by coupling a portion of RF output signal 132 (e.g., the signal to be emitted from antenna 114) via a coupling device 134 (e.g., an RF coupler). The coupled signal portion (shown as coupled signal 136) is provided to observation receiver 116. It should be appreciated that coupled signal 136 may be provided by coupling a portion of the RF signal at any location along the RF portion of the transmit signal path 111a. In one embodiment signal 136 is provided by coupling a portion of the RF signal from the output of amplifier 108. In one embodiment signal 136 is provided by coupling a portion of the RF signal from the transmit signal path which is as close as possible to the input of antenna 114. In one embodiment signal 136 is provided by coupling a portion of the RF signal emitted from antenna 114 (i.e. coupled from an output of the antenna).

Observation receiver 116 down-converts coupled signal 136 and, in some embodiments, further processes the down-converted signal (e.g. by digitizing the down converted observed signal) to provide observed signal 138 to DPD system 104. In some embodiments, observed signal 138 is provided to DPD training system 120. DPD system may intermittently use data from the observation receive 116.

Thus, DPD system 104 may receive any of: an RF signal (e.g. observed signal 138), a down-converted RF signal (e.g. a lower frequency version of observed signal 138) or a digital signal representing either an RF signal (e.g. observed signal 138) or a down-converted RF signal.

DPD training system 120 receives and processes the signals provided thereto (e.g. any of an RF signal (e.g. coupled signal 136), a frequency translated version of the RF signal (e.g. a lower or higher frequency version of signal 136) or a digital signal representing either an RF signal or a down-converted RF signal (e.g. observed signal 138). DPD training system 120 receives and may process the signals provided thereto using, a variety of techniques including but not limited to polynomial functions, memory polynomial functions, and the like to generate one or more updated DPD values. The particular processing performed by DPD training system may vary depending upon the requirements and hardware used in a particular RF system in which the DPD training system is included. The particular processing to use in particular RF system is selected to generate a set of DPD values which improve efficiency and signal integrity of the system relative to a previous set of DPD values. The DPD training system may generate new DPD values and/or may generate updates to existing DPD values.

Based upon the DPD values provided by DPD training system 120, controller 102 may implement DPD techniques that change (and ideally improve) RF transmit system efficiency and signal integrity by adjusting system performance to account for various uncertainties in RF transmit system 100, such as PVT variations or other operating conditions.

In an embodiment, when RF transmit system 100 is first powered for operation, the DPD values stored in DPD table(s) 118 are set to predetermined initial values selected to ensure that the RF transmit system 100 satisfies performance requirements with considerable margin (i.e. the conservative DPD values). Thus, the predetermined initial DPD values ensure that signal integrity requirements are met regardless of variations in component characteristics (e.g., PVT variations) or other operating conditions.

Consequently, the power efficiency of RF transmit system 100 (e.g., RF amplifier 108) may be relatively low. Over time, data from observation receiver 116 (e.g., observed signal 138) is employed by DPD training system 120 to replace and/or update the predetermined initial DPD values to build specialized DPD tables ("mappings") for the various conditions that are encountered.

As the amount of data collected increases over operating time of RF transmit system 100, each value stored in DPD tables 118 converge toward a final value (i.e. a converged value) or a range of final values (i.e. a range of converged values). The set of converged (or "adapted") DPD values ideally result in efficient performance of the RF transmit system while also maintaining a high degree of signal integrity. Thus, with this approach, RF transmit system 100 adapts to achieve both high efficiency and a high degree of signal integrity compared with prior art approaches.

As the values stored in DPD table(s) 118 are changed and adapted to converge on a range or set of converged DPD values, RF amplifier 108 will increasingly operate in its nonlinear region(s) of operation. With this approach, over increasing time of use, RF transmit system 100 becomes increasingly power efficient as the DPD values are adapted and RF transmit system 100 adapts or evolves into a power-efficient system (and ideally, into a maximally power-efficient system).

Furthermore, such power efficiency is achieved without requiring difficult, expensive, and time-consuming factory calibration and quality control of RF transmit system 100 or of individual components employed within RF transmit system 100.

In an illustrative embodiment, RF transmit system 100 begins operation in a single supply mode operation at initial power on, where RF amplifier 108 operates with a single drain voltage (e.g., drain bias signal 142). Once the DPD values have been determined (e.g., adapted) and stored in DPD table(s) 118 (in embodiments employing DPD tables), RF transmit system 100 may transition to multilevel supply operation (e.g. two-level supply operation, then three-level supply operation, and so on, up to N-level supply operation, where N is a positive integer representing the number of voltages provided by multilevel power supply 122). This approach might be repeated for some or all operating conditions of system 100, such that, at first power on of system 100, the initial DPD values are such that no drain voltage adjustment of RF amplifier 108 is required to meet a desired performance level for at least signal integrity as well as other operating parameters. Over time of operation of system 100, however, increasingly fine adjustments may be made to the drain voltage of RF amplifier 108 (e.g., N-level supply operation), resulting in increasingly power efficient operation of RF amplifier 108.

In another illustrative embodiment, RF transmit system 100 begins operation using multiple supplies at initial power on (e.g., N-level supply operation), but with DPD system 104 employing conservative operational states or operational points (or no compression). Over time of operation of system 100, DPD values are determined (e.g., adapted) and stored in DPD table(s) 118 (in embodiments employing DPD tables), allowing DPD system 104 to employ deeper compression. This approach might be repeated for some or all operating conditions of system 100, such that, at first power on of system 100, no (or relatively little) compression is employed, but over time of operation of system 100, increasing compression can be employed, resulting in increasingly power efficient operation of RF amplifier 108. Further, such embodiments might employ continuous supply (e.g., analog) modulation, discrete-level supply modulation or a combination of both analog and discrete-level supply modulation in the final and/or driver stages of RF amplifier 108.

In an illustrative embodiment, at initial power on, RF transmit system 100 utilizes a first one of DPD tables 118 that includes DPD values for operation in both a middle-of-band and one or both extreme edges of a desired frequency band such that the first DPD table includes initial DPD values that are relatively conservative to ensure performance of RF transmit system 100 across the entire desired frequency band. Over time, DPD training system 120 adapts a plurality of DPD tables, for example, for use at low, middle, and high edges of a desired frequency band. In some embodiments, DPD table(s) 118 might be provided as separate tables or as a single, multi-dimensional table (e.g., one dimension for each of low, middle, and high edges of the desired frequency band). Alternatively, a combination of a plurality of separate tables and multi-dimensional DPD tables might be employed.

In an illustrative embodiment, RF transmit system 100 utilizes a first DPD table 118 to correspond to a first operating characteristic and/or PVT variation (e.g., temperature, frequency, etc.). The values stored in the table are conservative enough to ensure performance of RF transmit system 100 (i.e. that spectral requirements of the RF systems are met). Over time, separate DPD tables might be generated for each operating characteristic and/or PVT variation (e.g., temperature, frequency, etc.), the DPD values in each table may have increasingly fine granularity. A plurality of first DPD tables might be used for a corresponding plurality of characteristics and over time, additional, separate DPD tables might be generated for each characteristic.

In an illustrative embodiment, RF transmit system 100 provides alerts to DPD system 104 to indicate a change in operating characteristic(s) and/or operating conditions of RF transmit system 100. Such an alert could be triggered, for example, by a change in a component of the RF transmit system (e.g., changing a duplexer, RF amplifier, filter or other RF transmit system component, for example). In response to a change being detected, DPD table(s) 118 might be re-set to default (e.g., conservative) DPD values and DPD training is repeated to re-adapt the DPD values for the new operating conditions.

In another illustrative embodiment, a final level of aggression to arrive (and ideally optimize efficiency) is user-programmability. If a component characteristic (or combination of characteristics) is expected to have a first value or be within a first range of values (e.g., if an expected voltage standing wave ratio (VSWR) value at a diplexer input is 3:1), then DPD table(s) 118 are adapted to one level of operational state(s) or operational point(s) (which correlate to a first level of efficiency). If the same component characteristic (or same combination of characteristics) is expected to have a second different value or be within a second range of values (e.g., if expected VSWR at the diplexer input is 10:1), then DPD table(s) 118 are adapted to a second level of efficiency, which is different than and might be lower than, the first level of efficiency (e.g., the second level of efficiency corresponds to a less aggressive operational state of RF transmit system 100 than the first level of efficiency).

In general, the above techniques may be repeated for some or all operating conditions (e.g. temperature, carrier frequency, etc.) and may utilize continuous supply (i.e. analog) modulation, discrete-level supply modulation or a combination of both analog and discrete supply modulation in the final and/or driver stages of an RF amplifier provided in the RF transmit system. It should, of course, be appreciated that the concepts, circuits and techniques described herein can be used for either analog or discrete supply systems and can be generally applied to any type of power amplifier or RF transmit system.

Figure 4:
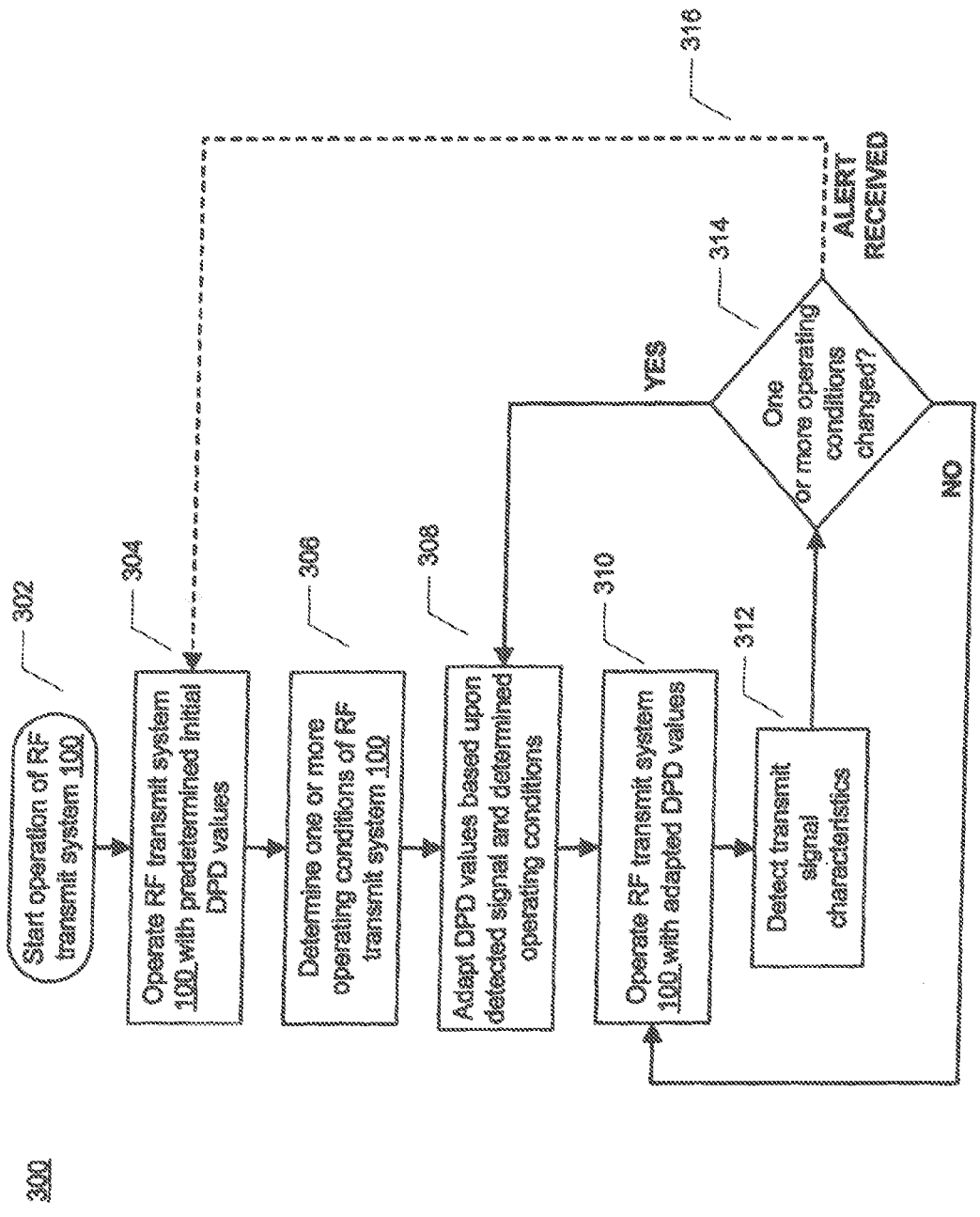
FIG. 4 is a flow diagram of an illustrative operating technique of an RF transmit system which employs a DPD adaptation technique in accordance with illustrative embodiments.

FIG. 4 is a flow diagram showing illustrative processing that can be implemented by and/or within an RF transmitter system having a DPD training capability such as the RF transmit systems described above in conjunction with FIGS. 1 and 2. Rectangular elements (typified by element 304), herein denoted "processing blocks," represent computer software instructions or groups of instructions. Diamond shaped elements (typified by element 314), herein denoted "decision blocks," represent computer software instructions, or groups of instructions, which affect the execution of the computer software instructions represented by the processing blocks.

Alternatively, the processing and decision blocks may represent operations performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the concepts, systems, circuits and techniques sought to be protected herein. Thus, unless otherwise stated, the blocks described below are unordered meaning that, when possible, the functions represented by the blocks can be performed in any convenient or desirable order.

Turning now to FIG. 4, an example of an operating technique 300 of an RF transmit system begins by powering the RF transmit system for operation as shown in block 302 (this assumes, of course, that the system has not been operating; in cases where the system is already operating, the processing may begin in block 306 to be described below).

Processing then proceeds to block 304, in which the RF transmit system is operated (e.g. transmits RF signals) using predetermined initial DPD values (e.g., conservative DPD values stored in one or more DPD table(s) such as DPD table(s) 118 in FIG. 3). Such initial DPD values are selected to ensure that the RF transmit system satisfies performance requirements (ideally, with considerable margin) regardless of variations in operating conditions or component characteristics (e.g., PVT variations). Consequently, the power efficiency of the RF transmit system is relatively low during initial operation. In some cases this may be due to the inefficiency of an RF power amplifier included in the RF transmit system.

At block 306, one or more operating conditions of the RF transmit system are determined. Such operating conditions may include, but are not limited to, the use of different transmission bands, different bandwidths, temperature (or changes in temperature), use of different carrier frequencies, voltage (or changes in voltage), humidity (or changes in humidity), RF amplifier load impedances, changes in RF amplifier load impedances and frequency of operation.

At block 308, a DPD system (which may be the same as or similar to DPD system 12, FIG. 1 or controller 32, FIG. 2 or DPD system 104, FIG. 3) changes (e.g. replaces and/or updates and/or otherwise adapts) one or more DPD values (e.g., values stored in DPD table(s) 118) based upon the one or more operating conditions of RF transmit system determined at block 306. At block 310, the RF transmit system is operated using the changed DPD values to ideally provide increasingly efficient performance of the RF transmit system over operating time of the system. At block 312, one or more characteristics of the transmit signal are detected (e.g., based on data from observation receiver 116 in the illustrative embodiment of FIG. 3).

In some embodiments, processing proceeds to decision block 314 in which the RF system determines whether one or more operating conditions have changed.

At block 314, if one or more operating conditions of the RF transmit system have changed (e.g., as determined based upon data from observation receiver 116), then process 300 returns to block 308 to change (e.g., replace and/or update and/or otherwise adapt) the DPD values based upon the changed operating conditions and/or PVT variations. If no operating conditions or PVT variations have changed at block 314, then the RF transmit system continues to operate with the current DPD values at block 310.

If, at block 314, the DPD system receives information (e.g. an alert or other signal) indicating a change in one or more operating characteristic(s) and/or operating conditions of RF transmit system 100 (e.g., a change in a component of the RF transmit system, such as a duplexer, RF amplifier, filter or other RF transmit system component, or a change due to environmental factors, for example), then the DPD values might optionally be re-set, as indicated by dashed line 316, to default DPD values (e.g., conservative DPD values) and DPD training is repeated to re-adapt the DPD values for the new operating conditions and/or PVT variations. Such re-adapting may be accomplished, for example, by a loop of blocks 308, 310, 312 and 314.

Thus, in this illustrative embodiment, over time of operation of RF transmit system 100, blocks 308, 310, 312 and 314 operate in a loop to change (e.g., replace and/or update and/or otherwise adapt) the DPD values to operate the RF transmit system with high signal integrity and power efficiency over a wide range of different and changing environmental conditions and/or circuit component characteristics as the DPD values are adapted.

As noted above, in some embodiments, RF transmit system begins operation in a single supply mode operation at initial power on (e.g., at block 304), where an RF amplification system (such as amplifier 108 in FIG. 3) operates with a single voltage value (e.g., a single drain bias signal 142). Once the DPD values have been adapted (e.g., one or more times at block 308), the RF transmit system transitions to operating with increasing numbers of supplies, for example up to N-level supply operation (e.g., at block 310), where N is a positive integer representing the number of voltages provided by a multilevel power supply (such as a multilevel power supply 122 described above in conjunction with FIG. 3) to an amplification system.

This approach might be repeated for some or all operating conditions of RF transmit system by a loop of blocks 308, 310, 312 and 314. For example, at first "power-on" (or start up) of the RF transmit system, no drain voltage adjustment of an RF amplifier is performed (e.g., the system operates in a single supply mode), but over a period of time, increasingly fine adjustments can be made to the drain voltage of the RF amplifier (e.g., N-level supply operation), resulting in increasingly power efficient operation of the RF amplifier.

Also as described, in some embodiments, the RF transmit system begins operation using multiple supplies at initial power on (e.g., N-level supply operation at block 304), but with a DPD system employing conservative operational states or conservative operational points. Over a period of time of operation of the RF transmit system, DPD values are adapted, allowing a DPD system to employ more aggressive and hence more efficient operational states or operational points. This approach might be repeated for some or all operating conditions of RF transmit system by a loop of blocks 308, 310, 312 and 314, such that, at first power-on of the RF transmit system, a conservative operational state is used (e.g. no or relatively little compression) is employed, but over time of operation, increasingly aggressive operational states or points can be employed, resulting in increasingly power efficient operation of an RF amplification system. Other embodiments might employ both single-supply operation with a conservative operational state at initial power on to ensure operation of the RF transmit system across a wide range of operating conditions.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC). In some embodiments, the "processor" can be embodied in a microprocessor with associated program memory. In some embodiments, the "processor" can be embodied in a discrete electronic circuit. The "processor can be analog, digital or mixed-signal.

While the exemplary embodiments have been described with respect to processes of circuits, described embodiments might be implemented as a single integrated circuit, a multi-chip module, a single card, or a multi-card circuit pack. Further, as would be apparent to one skilled in the art, various functions of circuit elements might also be implemented as processing blocks in a software program. Such software might be employed in, for example, a digital signal processor, micro-controller, or general purpose computer.

Some embodiments might be implemented in the form of methods and apparatuses for practicing those methods. Described embodiments might also be implemented in the form of program code embodied in tangible media, such as magnetic recording media, hard drives, floppy diskettes, magnetic tape media, optical recording media, compact discs (CDs), digital versatile discs (DVDs), solid state memory, hybrid magnetic and solid state memory, or any other machine-readable storage medium, wherein, when the program code is loaded into and executed by a machine, such as a computer, the machine becomes an apparatus for practicing the claimed invention.

Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a processing device, the program code segments combine with the processor to provide a unique device that operates analogously to specific logic circuits. Such processing devices might include, for example, a general purpose microprocessor, a digital signal processor (DSP), a reduced instruction set computer (RISC), a complex instruction set computer (CISC), an application specific integrated circuit (ASIC), a field programmable gate array (FPGA), a programmable logic array (PLA), a microcontroller, an embedded controller, a multi-core processor, and/or others, including combinations of the above. Described embodiments might also be implemented in the form of a bitstream or other sequence of signal values electrically or optically transmitted through a medium, stored magnetic-field variations in a magnetic recording medium, etc., generated using a method and/or an apparatus as recited in the claims.

Reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the words "exemplary" and "illustrative" are used herein to mean serving as an example, instance, or illustration. Any aspect or design described herein as "exemplary" or "illustrative" is not necessarily to be construed as preferred or advantageous over other aspects or designs. Rather, use of the words "exemplary" and "illustrative" is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing the embodiments and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments.

It will be further understood that various changes in the details, materials, and arrangements of the parts that have been described and illustrated herein might be made by those skilled in the art without departing from the scope of the following claims.

We claim:

1. A radio frequency (RF) transmit system comprising:
   a controller configured to provide data signals at an output thereof;
   an RF signal generator having an input coupled to the output of said controller, said RF signal generator configured to receive data signals from said controller and in response thereto, to provide an RF signal at an output thereof;
   an RF signal path having a first end coupled to the output of said RF signal generator and having a second end, said RF transmit signal path comprising an RF amplifier;
   an RF coupler coupled to said RF transmit signal path and disposed to couple a portion of an RF signal from said RF transmit signal path;
   an observation receiver having an input and an output, with the input of said observation receiver coupled to said RF coupler and said observation receiver configured to receive the coupled portion of the RF signal from said RF coupler;
   a digital pre-distortion (DPD) system having an input coupled to the output of said observation receiver, said DPD system having stored therein one or more initial DPD values selected to ensure that the RF transmit system operates with a signal integrity which meets a minimum desired performance criteria upon initial power on of the RF transmit system and wherein the DPD system is configured to receive one or more signals from said observation receiver and in response thereto, to adapt one or more DPD values of the RF transmit system over a period of time and a range of operating conditions of the RF transmit system and to provide one or more adapted DPD values to said controller; and
   a supply modulator coupled to receive one or more DPD values from one of:
      said DPD system; and
      said controller.

2. The RF system of claim 1 wherein the one or more initial DPD values enable operation of the RF transmit system at a predetermined power efficiency level and a predetermined signal integrity level at middle, low and high portions of a desired RF frequency band.

3. The RF system of claim 1 wherein said observation receiver is configured to process the coupled signal provided thereto and provide feedback information about the coupled signal to said DPD system.

4. The RF transmit system of claim 3, wherein said DPD system comprises a training system configured to adapt the one or more DPD values based upon the provided feedback information.

5. The RF system of claim 1 further comprising an antenna having an input coupled to the second end of the RF signal path and wherein the RF coupler is disposed between an output of the RF amplifier and the input of the antenna.

6. The RF system of claim 1 wherein the one or more DPD values correspond to at least one setting of the supply modulator.

7. The RF system of claim 1 wherein:
   said RF amplifier is provided a drain bias terminal;
   said supply modulator is coupled to the drain bias port of said RF amplifier to provide a bias voltage to said RF amplifier;
   said digital pre-distortion (DPD) system is configured to adapt one or more DPD values of the RF transmit system during an operating time and a range of operating conditions of the RF transmit system, the one or more DPD values corresponding to at least one of: (i) at least one setting of said supply modulator, and (ii) at least one setting of said RF signal generator; and
   the one or more adapted DPD values provide operation of the RF transmit system at a determined power efficiency level to achieve a desired signal integrity level over the range of operating conditions of the RF transmit system.

8. The RF transmit system of claim 1, wherein said DPD system comprises one or more DPD tables configured to store one or more adapted DPD values.

9. The RF transmit system of claim 6, wherein the one or more DPD tables comprise a plurality of specialized DPD tables with each of the specialized DPD tables based upon the provided feedback information for different ones or sets of operating conditions of the RF transmit system.

10. The RF transmit system of claim 6, wherein the one or more DPD tables comprise a single DPD table and wherein the one or more initial predetermined DPD values stored in the single DPD table provide operation of the RF transmit system at a predetermined minimum power efficiency level (and a predetermined minimum signal integrity level at a middle, a low extreme, and a high extreme of a desired frequency band).

11. The RF transmit system of claim 1, wherein the initial predetermined DPD values provide operation of the at least one voltage modulator to provide the bias voltage selected from a single supply voltage level.

12. The RF transmit system of claim 11, further comprising a multilevel power supply wherein the one or more adapted DPD values provide operation of the supply modulator to provide a bias voltage selected from N discrete supply voltage levels, where N is a positive integer greater than one.

13. The RF transmit system of claim 12, wherein the at least one setting of the at least one supply modulator comprises a control signal to select one of the N discrete supply signal levels to bias the RF amplifier.

14. The RF transmit system of claim 1, wherein the initial predetermined DPD values provide operation of the RF transmit system with a predetermined initial compression level.

15. The RF transmit system of claim 14, wherein the one or more adapted DPD values provide operation of the RF transmit system with a determined adapted compression level, the adapted compression level employing higher compression than the predetermined initial compression level.

16. The RF transmit system of claim 1 wherein:
   said RF amplifier is a first one of a plurality of RF amplifiers; and
   said supply modulator is a first one of a plurality of supply modulators.

17. The RF transmit system of claim 1, further comprising:
   at least one filter circuit coupled between the at least one voltage modulator and the at least one RF amplifier, the at least one filter circuit configured to reduce RF signal components at the RF output of the least one RF amplifier,
   wherein at least one setting of the at least one filter circuit is adapted in response to one or more operating characteristics of the at least one RF amplifier.

18. A radio frequency (RF) transmit system comprising:
a controller configured to provide data signals at an output thereof;
an RF signal generator having an input coupled to the output of said controller, said RF signal generator configured to receive data signals from said controller and in response thereto, to provide an RF signal at an output thereof;
an RF signal path having a first end coupled to the output of said RF signal generator and having a second end, said RF transmit signal path comprising an RF amplifier;
an RF coupler coupled to said RF transmit signal path and disposed to couple a portion of an RF signal from said RF transmit signal path;
an observation receiver having an input and an output, with the input of said observation receiver coupled to said RF coupler and said observation receiver configured to receive the coupled portion of the RF signal from said RF coupler; and
a digital pre-distortion (DPD) system having an input coupled to the output of said observation receiver, said DPD system having stored therein one or more initial DPD values selected to ensure that the RF transmit system operates with a signal integrity which meets a minimum desired performance criteria upon initial power on of the RF transmit system and wherein the DPD system is configured to receive one or more signals from said observation receiver and in response thereto, to adapt one or more DPD values of the RF transmit system over a period of time and a range of operating conditions of the RF transmit system and to provide one or more adapted DPD values to said controller;
wherein said observation receiver is configured to process the coupled signal provided thereto and provide feedback information about the coupled signal to said DPD system
wherein said DPD system comprises a training system configured to adapt the one or more DPD values based upon the provided feedback information; and
wherein said DPD system is configured to reset and re-adapt the one or more DPD values in response to a change of at least one of the operating conditions of the RF transmit system.

19. A method of operating a radio frequency (RF) transmit system having at least one RF amplifier having an RF input port coupled to an RF source, an RF output port coupled to a transmit signal path, and a drain bias port, at least one voltage modulator coupled to the drain bias port of the least one RF amplifier to provide a bias voltage, and a digital pre-distortion (DPD) system, the method comprising:
operating the RF transmit system in a first operating mode;
adapting one or more DPD values of the DPD system during an operating time and a range of operating conditions of the RF transmit system, the one or more DPD values corresponding to at least one of: (i) at least one setting of the at least one voltage modulator, and (ii) at least one setting of the RF source; and
after operating the RF transmit system in the first operating mode, operating the RF transmit system in at least one operating mode corresponding to the one or more adapted DPD values, wherein the one or more adapted DPD values provide operation of the RF transmit system at a determined maximum power efficiency level to achieve a desired signal integrity level over the range of operating conditions of the RF transmit system
operating a supply modulator coupled to receive one or more DPD values from one of:
said DPD system; and
said controller.

20. The method of claim 19, further comprising:
coupling a signal between the transmit signal path and an antenna of the RF transmit system;
providing the coupled signal to an observation receiver of the RF transmit system;
providing, by the observation receiver, feedback information about the coupled signal to the DPD system; and
adapting the one or more DPD values based upon the provided feedback information.

21. The method of claim 20, comprising:
storing the one or more adapted DPD values in one or more associated DPD tables.

22. The method of claim 21, comprising:
generating one or more specialized DPD tables based upon the provided feedback information for various operating conditions of the RF transmit system.

23. The method of claim 21, comprising:
generating a single DPD table for storing one or more initial predetermined DPD values, wherein the one or more initial predetermined DPD values provide operation of the RF transmit system in the first operating mode.

24. The method of claim 19, comprising:
in the first operating mode, operating the RF transmit system at a predetermined minimum power efficiency level and a predetermined minimum signal integrity level at a desired frequency.

25. The method of claim 19, comprising
in the first operating mode, operating the RF transmit system at a predetermined minimum power efficiency level and a predetermined minimum signal integrity level at a middle, a low extreme, and a high extreme of a desired frequency band.

26. The method of claim 19, comprising:
in the first operating mode, operating the at least one voltage modulator to provide the bias voltage selected from a single supply voltage level.

27. The method of claim 19, comprising:
in the at least one next operating mode, operating the at least one voltage modulator based upon the one or more adapted DPD values to provide the bias voltage selected from N discrete supply voltage levels, where N is a positive integer greater than one.

28. The method of claim 19, comprising:
in the first operating mode, operating the RF transmit system with a predetermined initial compression level.

29. The method of claim 19, comprising:
in the at least one next operating mode, operating the RF transmit system with a determined adapted compression level based upon the one or more adapted DPD values, the adapted compression level employing higher compression than the predetermined initial compression level.

30. The method of claim 19, wherein the operating conditions comprise at least one of: one or more process, voltage, and temperature (PVT) variations of one or more components of the RF transmit system, and one or more physical characteristics of one or more components of the RF transmit system.

31. The method of claim 30, comprising:
resetting and re-adapting the one or more DPD values when at least one of the operating conditions of the RF transmit system is changed.

32. The method of claim 19, wherein the at least one setting of the RF source comprises a drive level of the at least one RF amplifier.

33. The method of claim 19, further comprising:
reducing, by at least one filter circuit coupled between the at least one voltage modulator and the at least one RF amplifier, RF signal components at the RF output of the least one RF amplifier; and
adapting at least one setting of the at least one filter circuit in response to one or more operating characteristics of the at least one RF amplifier.

* * * * *